US009218514B2

(12) United States Patent
Kim et al.

(10) Patent No.: US 9,218,514 B2
(45) Date of Patent: Dec. 22, 2015

(54) APPARATUSES AND METHOD OF SWITCHED-CAPACITOR INTEGRATOR

(71) Applicants: Samsung Electronics Co., Ltd., Suwon-si (KR); Industry-University Cooperation Foundation Hanyang University, Erica Campus, Ansan-si (KR)

(72) Inventors: Jong Jin Kim, Hwaseong-si (KR); Jeong Jin Roh, Seoul (KR); Young Hyun Yoon, Gwangmyoeng-si (KR); Jun Whon Uhm, Anyang-si (KR); Dong Wook Kim, Seoul (KR)

(73) Assignees: Samsung Electronics Co., Ltd., Suwon-si (KR); Industry-University Cooperation Foundation Hanyang University, Erica Campus, Ansan-si (KR)

( * ) Notice: Subject to any disclaimer, the term of this patent is extended or adjusted under 35 U.S.C. 154(b) by 0 days.

(21) Appl. No.: 14/531,182

(22) Filed: Nov. 3, 2014

(65) Prior Publication Data

US 2015/0123829 A1    May 7, 2015

(30) Foreign Application Priority Data

Nov. 6, 2013  (KR) .................. 10-2013-0134277

(51) Int. Cl.
*H03M 3/00* (2006.01)
*G06G 7/184* (2006.01)
*H03M 1/66* (2006.01)

(52) U.S. Cl.
CPC .............. *G06G 7/184* (2013.01); *H03M 1/66* (2013.01); *H03M 3/464* (2013.01); *H03M 3/496* (2013.01)

(58) Field of Classification Search
CPC ......... H03M 3/43; H03M 3/322; H03M 3/35; H03M 3/452; H03M 3/424; H03M 3/46; H03M 3/10665; H03M 3/66; H03M 3/464; H03M 3/496; G06G 7/184
USPC .................................. 341/130–144; 375/252
See application file for complete search history.

(56) References Cited

U.S. PATENT DOCUMENTS 4,905,006 A * 2/1990 Pelgrom ........................ 341/150
6,087,969 A * 7/2000 Stockstad et al. ............. 341/143

(Continued)

FOREIGN PATENT DOCUMENTS

WO      WO 02/065644 A2      8/2002

OTHER PUBLICATIONS

Hurst, Paul J., and Ken C. Dyer. "An improved double sampling scheme for switched-capacitor delta-sigma modulators." *Circuits and Systems, 1992. ISCAS'92. Proceedings. 1992 IEEE International Symposium on.* vol. 3. IEEE, 1992.

(Continued)

*Primary Examiner* — Lam T Mai
(74) *Attorney, Agent, or Firm* — NSIP Law

(57) ABSTRACT

Provided is a switched-capacitor integrator, a method of operating the switched-capacitor integrator, and apparatuses including the switched-capacitor integrator. The switched-capacitor integrator including an amplifier including a first input terminal, a second input terminal, and an output terminal, a first capacitor disposed between the first input terminal and the output terminal, and a switched capacitor circuit configured to sample an input signal in response to control signals, and to integrate a difference between a feedback signal and the input signal while sampling the input signal.

19 Claims, 12 Drawing Sheets

(56) References Cited

U.S. PATENT DOCUMENTS

| | | | | |
|---|---|---|---|---|
| 6,191,648 | B1* | 2/2001 | Lewicki | 327/554 |
| 6,304,608 | B1* | 10/2001 | Chen et al. | 375/252 |
| 6,587,144 | B1* | 7/2003 | Kim | 348/241 |
| 7,082,377 | B1* | 7/2006 | Aslan et al. | 702/130 |
| 7,129,875 | B1* | 10/2006 | Altun et al. | 341/143 |
| 7,362,252 | B1* | 4/2008 | Pai | 341/143 |
| 2007/0194580 | A1* | 8/2007 | Raasch | 294/1.4 |
| 2007/0247340 | A1 | 10/2007 | Tada | |
| 2008/0024342 | A1* | 1/2008 | Deval et al. | 341/143 |
| 2010/0102878 | A1* | 4/2010 | Nagata | 330/86 |
| 2013/0187803 | A1* | 7/2013 | Kaald | 341/143 |

OTHER PUBLICATIONS

Extended European Search Report issued by the European Patent Office on Apr. 7, 2015, for corresponding European Patent Application No. 14191285.7 (9 pages).

* cited by examiner

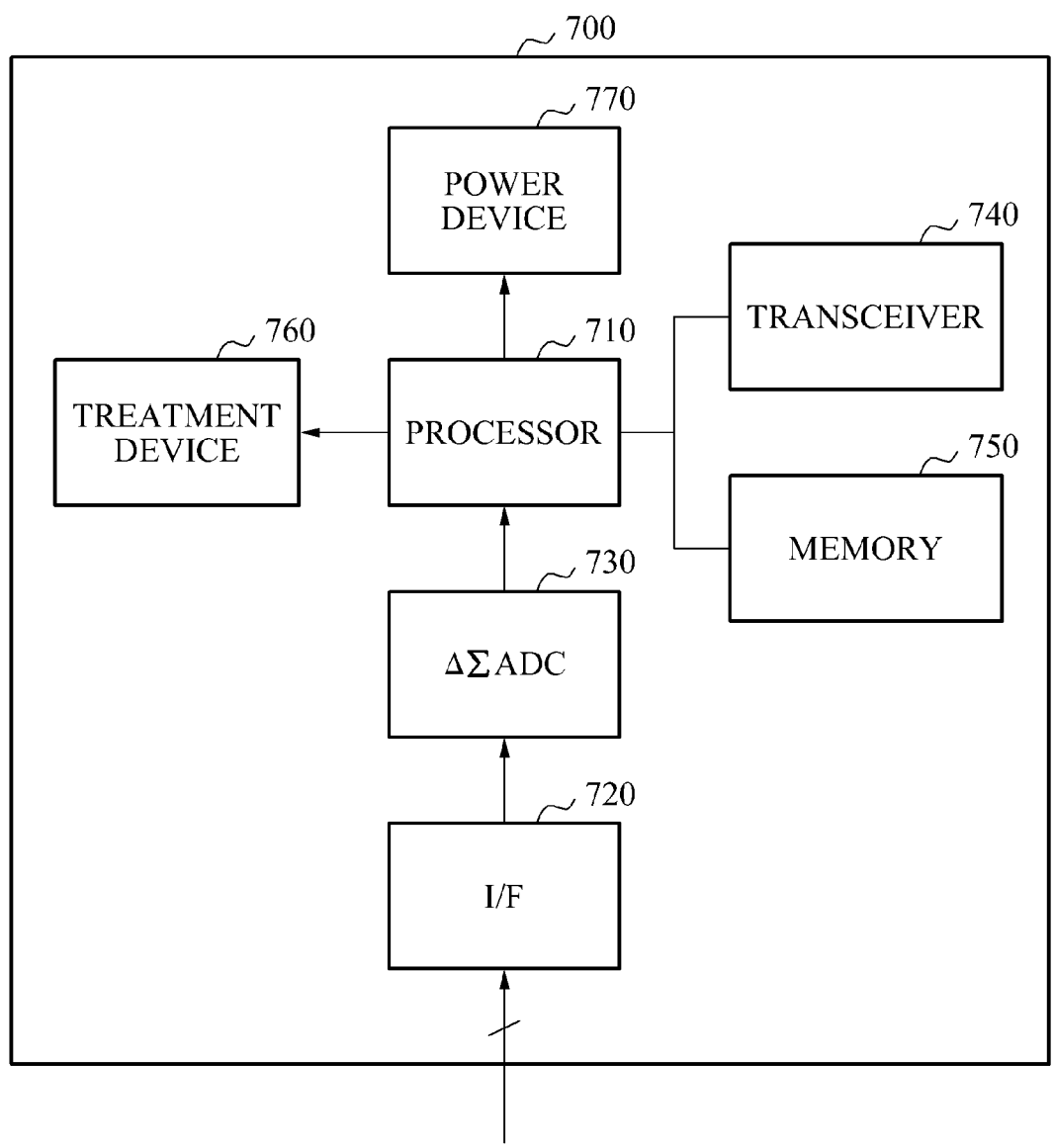

APPARATUSES AND METHOD OF SWITCHED-CAPACITOR INTEGRATOR

RELATED APPLICATIONS

This application claims the benefit under 35 USC 119(a) of Korean Patent Application No. 10-2013-0134277, filed on Nov. 6, 2013, in the Korean Intellectual Property Office, the entire disclosure of which is incorporated herein by reference for all purposes.

BACKGROUND

1. Field

The following description relates to a switched-capacitor integrator and a method of operating the switched-capacitor integrator.

2. Description of Related Art

To overcome difficulty of signal processing in an analog area, in comparison to signal processing in a digital area, research on converting an analog signal into a digital signal is being conducted. Analog to digital conversion may indicate a process of converting an analog signal into a digital signal. A degree of accuracy in converting the analog signal into the digital signal may be a significant factor in the analog to digital conversion. A delta-sigma analog-to-digital convertor (ADC) may oversample an analog input signal, convert the oversampled analog input signal into a one-bit digital bitstream through delta-sigma modulation, and generate multi-bit digital data from an ne-bit digital bitstream.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a switched-capacitor integrator including an amplifier comprising a first input terminal, a second input terminal, and an output terminal, a first capacitor disposed between the first input terminal and the output terminal, and a switched capacitor circuit configured to sample an input signal in response to control signals, and to integrate a difference between a feedback signal and the input signal while sampling the input signal.

The switched capacitor circuit may include a first transmission path to transmit the input signal, a second transmission path to transmit the input signal, and an array of switches configured: to sample the input signal transmitted through one of the first transmission path or the second transmission path, based on a clock phase of the control signals, and to integrate, using the first capacitor, a difference between the feedback signal and the input signal while sampling the input signal.

The array of switches may further be configured to sample the input signal transmitted through the first transmission path in a first clock phase of the control signals, and to integrate, using the first capacitor, a difference between the feedback signal and the input signal transmitted through the second transmission path.

The array of switches may be further configured to sample the input signal transmitted through the second transmission path in a second clock phase of the control signals, and to integrate, using the first capacitor, a difference between the feedback signal and the input signal transmitted through the first transmission path.

A second capacitor may be disposed in the first transmission path and a third capacitor is disposed in the second transmission path.

A capacitance of the second capacitor may be identical to a capacitance of the third capacitor.

The first input terminal may be a negative input terminal, the second input terminal may be a positive input terminal, and the second input terminal may be connected to a ground.

The amplifier may be one of an operational amplifier or an operational transconductance amplifier (OPA).

The switched capacitor circuit may be further configured to integrate the difference between a feedback signal and the input signal using the first capacitor.

In another general aspect, there is provided a digital to analog converter (DAC) to transmit a feedback signal, and a switched-capacitor integrator configured to sample an input signal in response to control signals, and to integrate a difference between the feedback signal and the input signal to generate an integral signal while sampling the input signal.

The delta-sigma modulator may include a comparator configured to generate an L-bit digital bitstream based on the integral signal and a reference signal, L being a real number.

The switched-capacitor integrator may include an amplifier comprising a first input terminal, a second input terminal, and an output terminal, a first capacitor disposed between the first input terminal and the output terminal, a first transmission path to be connected to the first input terminal, and transmit the input signal, a second transmission path to be connected to the first input terminal, and transmit the input signal, and an array of switches configured: to sample the input signal transmitted through one of the first transmission path or the second transmission path, based on a clock phase of the control signals, and to integrate, using the first capacitor, a difference between the feedback signal and the input signal.

The array of switches may be further configured to sample the input signal transmitted through the first transmission path in a first clock phase of the control signals, and to simultaneously integrate, using the first capacitor, a difference between the feedback signal and the input signal transmitted through the second transmission path.

The array of switches may be further configured to sample the input signal transmitted through the second transmission path in a second clock phase of the control signals, and to simultaneously integrate, using the first capacitor, a difference between the feedback signal and the input signal transmitted through the first transmission path.

A second capacitor configured to sample the input signal may be disposed in the first transmission path to, and a third capacitor configured to sample the input signal may be disposed in the second transmission path.

A capacitance of the second capacitor may be identical to a capacitance of the third capacitor.

The first input terminal may be a negative input terminal, the second input terminal may be a positive input terminal, and the second input terminal may be connected to a ground.

The amplifier may be one of an operational amplifier or an operational transconductance amplifier (OPA).

The delta-sigma modulator may include a digital filter configured to filter an output signal of the delta-sigma modulator.

The delta-sigma modulator may include a plurality of switched-capacitor integrators configured to sample an input signal in response to control signals, and to integrate a difference between the feedback signal and the input signal to generate an integral signal while sampling the input signal.

In another general aspect, there is provided a method of sampling an input signal, the method including sampling an input signal, at a switched capacitor circuit, based on a clock phase of control signals, and integrating a difference between the input signal and the feedback signal while sampling the input signal based on the clock phase of the control signals.

Other features and aspects will be apparent from the following detailed description, the drawings, and the claims.

BRIEF DESCRIPTION OF THE DRAWINGS

FIG. 12 is a diagram illustrating an example of the electronic system including the delta-sigma ADC of FIG. 1.

Figure 1:
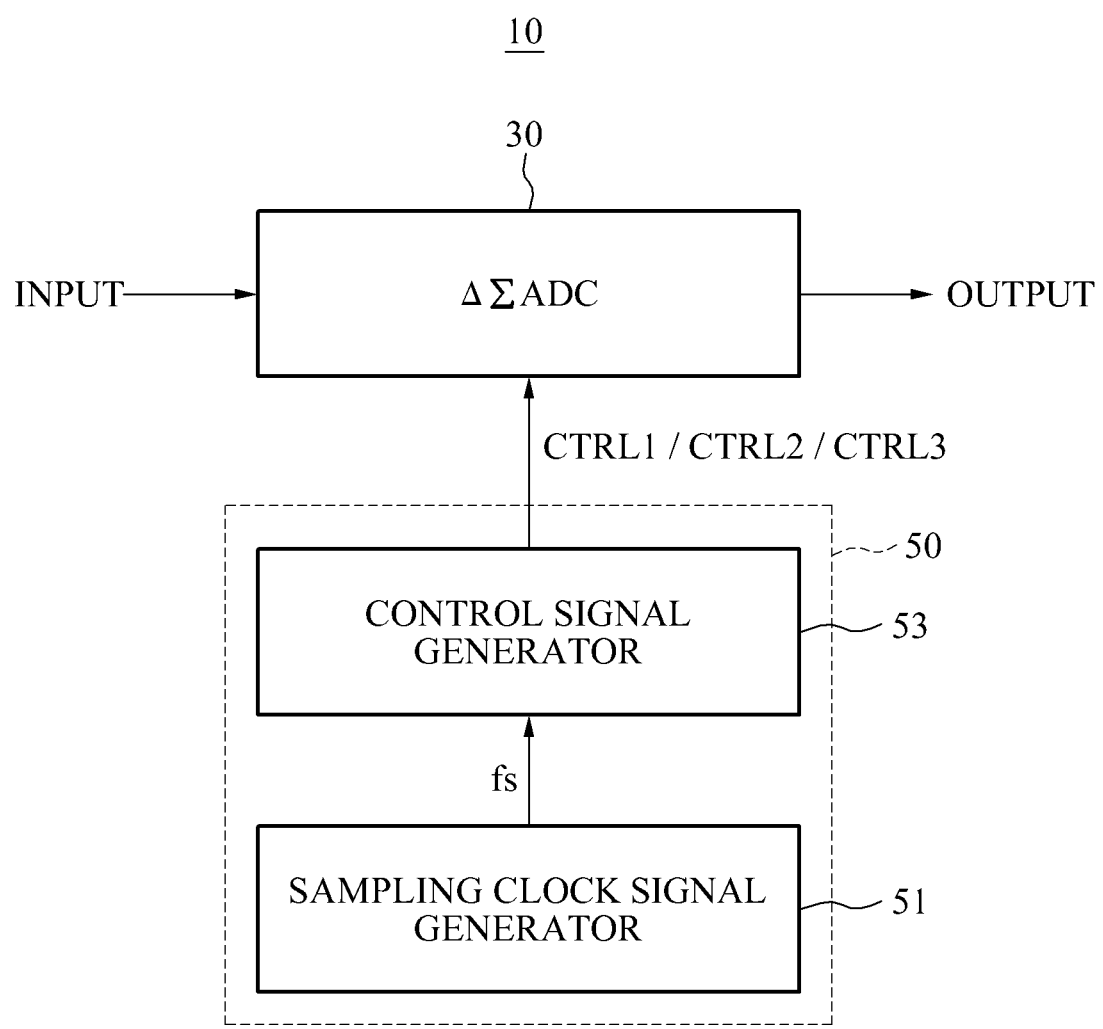
FIG. 1 is a diagram illustrating an example of an electronic system including a delta-sigma analog-to-digital converter (ADC).

Throughout the drawings and the detailed description, unless otherwise described, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 is a diagram illustrating an example of an electronic system 10 including a delta-sigma analog-to-digital converter (ADC) 30. Referring to FIG. 1, the electronic system 10 may include the delta-sigma ADC 30 and a signal generation circuit 50.

The electronic system may be implemented by device, such as, for example, a personal computer (PC), a data server, or a portable electronic device. As a non-exhaustive illustration only, the portable electronic device described may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device or portable navigation device (PND), a handheld game console, an e-book, and devices such as a high definition television (HDTV), an optical disc player, a DVD player, a Blue-ray player, a setup box, or any other device capable of wireless communication or network communication consistent with that disclosed herein.

In response to control signals CTRL1, CTRL2, and CTRL3 that are output from the signal generation circuit 50, the delta-sigma ADC 30 may sample an input signal (INPUT), and simultaneously integrate a difference between a feedback signal and the INPUT, while sampling the INPUT.

The delta-sigma ADC 30 may generate a digital signal (OUTPUT) corresponding to the INPUT based on the integration and output of the OUTPUT. For example, the delta-sigma ADC 30 may generate multi-bit digital data corresponding to the INPUT based on the integration and may output the generated multi-bit digital data as the OUTPUT.

The INPUT may be an analog signal. The signal generation circuit 50 may generate the control signals CTRL1, CTRL2, and CTRL3. The signal generation circuit 50 may include a sampling clock signal generator 51 and a control signal generator 53. The sampling clock signal generator 51 may generate a sampling signal fs having a sampling frequency, and output the generated sampling signal fs to the control signal generator 53.

In response to the sampling signal fs, the control signal generator 53 may generate the control signals CTRL1, CTRL2, and CTRL3. The sampling signal generator 53 may output the generated control signals CTRL1, CTRL2, and CTRL3 to the delta-sigma ADC 30.

The delta-sigma ADC 30 may maintain an identical over-sampling ratio (OSR) when the sampling frequency of the sampling signal fs is decreased by 50%.

When the sampling frequency is decreased by 50%, a size of bandwidth of an amplifier included in the delta-sigma ADC 30 may be decreased by 50%. Thus, power consumption of the amplifier may be reduced in the delta-sigma ADC 30. The delta-sigma ADC 30 may operate in a low power.

Although the signal generation circuit 50 is included external to the delta-sigma ADC 30 in FIG. 1, the signal generation circuit 50 may be included in an internal area of the delta-sigma ADC 30.

Figure 2:
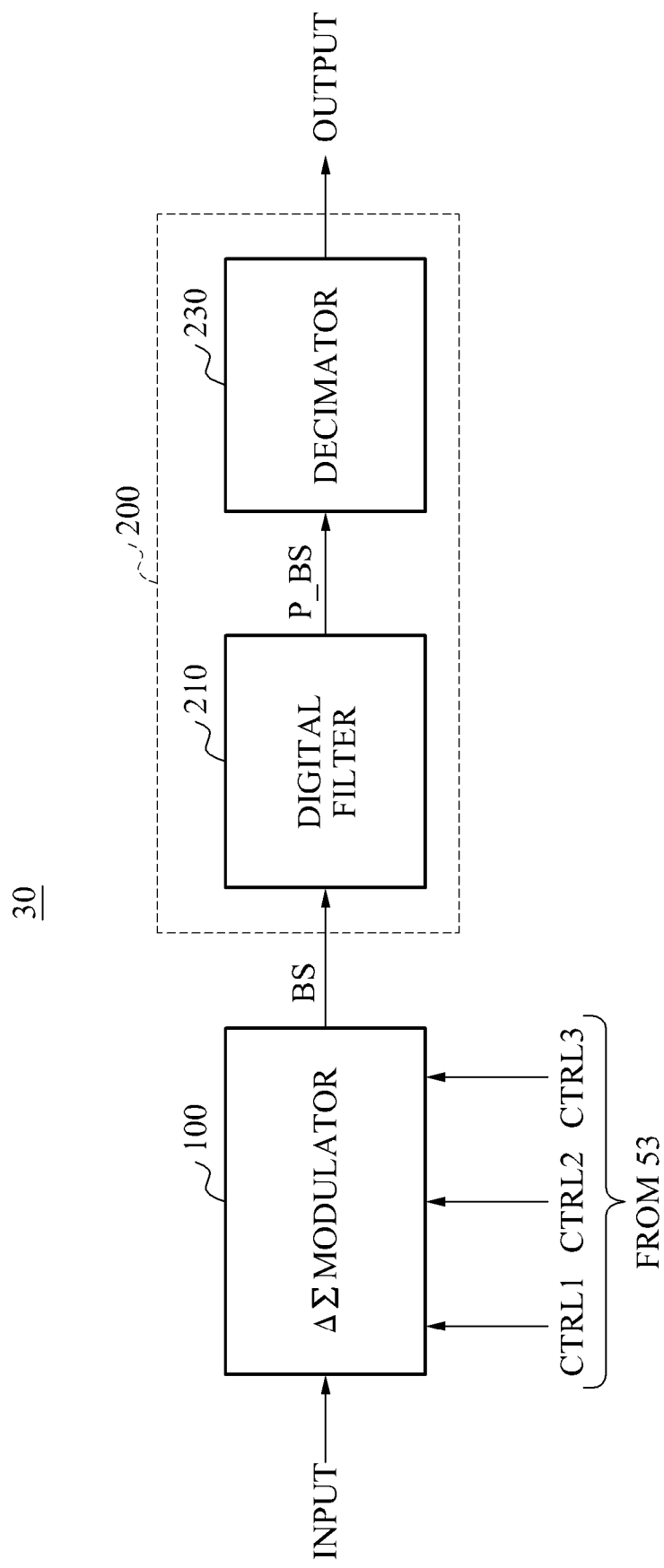
FIG. 2 is a diagram illustrating an example of the delta-sigma ADC of FIG. 1.

FIG. 2 is a diagram illustrating an example of the delta-sigma ADC 30 of FIG. 1.

Referring to FIGS. 1 and 2, the delta-sigma ADC 30 may include a delta-sigma modulator 100 and a decimation filter 200. The configuration shown in FIG. 2 is a non-exhaustive illustrations of the delta-sigma ADC 30, and other configurations of the delta-sigma ADC 30 are considered to be well within the scope of the present disclosure. For example, in another configuration, the decimation filter 200 may be included in the delta-sigma modulator 100.

The delta-sigma modulator 100 may sample an INPUT in response to control signals CTRL1, CTRL2, and CTRL3, and the delta-sigma modulator 100 may integrate a difference between a feedback signal and the INPUT, while sampling the INPUT. The delta-sigma modulator 100 may generate an L-bit digital bitstream (BS) based on the integration, and may output the generated L-bit digital BS to the decimation filter 200, L being a real number.

The decimation filter 200 may generate an OUTPUT corresponding to the INPUT based on the L-bit digital BS. For example, the decimation filter 200 may generate multi-bit digital data corresponding to the INPUT based on the L-bit digital BS, and may output the generated multi-bit digital data as the OUTPUT.

The decimation filter 200 may include a digital filter 210 and a decimator 230. The digital filter 210 may receive the L-bit digital BS, and process the received L-bit digital BS. For example, the digital filter 210 may reduce noise or high-frequency components included in the L-bit digital BS. For example, the digital filter 210 may extract low-frequency components included in the L-bit digital BS using a low pass digital filter.

The digital filter 210 may process the L-bit digital BS, and may output the processed L-bit digital BS to the decimator 230.

The decimator 230 may receive a processed digital bitstream P_BS, convert the processed digital bitstream P_BS into multi-bit digital data, and output the converted multi-bit digital data into the OUTPUT.

In a non-exhaustive example, the decimator 230 may decrease a transmission rate of the multi-bit digital data, for example, the OUTPUT using a decimator filter.

Figure 3:
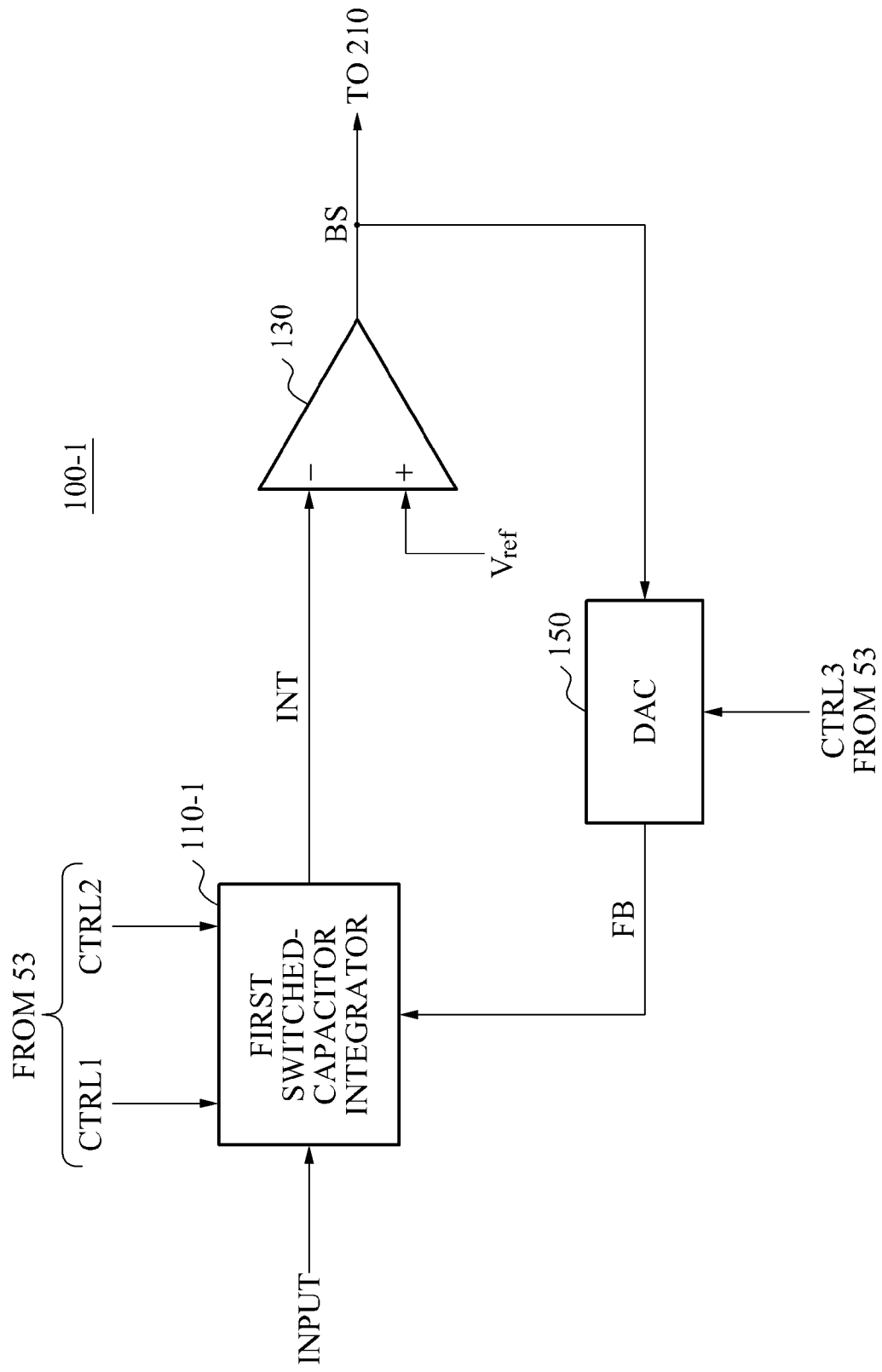
FIG. 3 is a diagram illustrating an example of the delta-sigma modulator of FIG. 2.

FIG. 3 is a diagram illustrating an example of the delta-sigma modulator 100 of FIG. 2.

Referring to FIGS. 1 through 3, a delta-sigma modulator 100-1 of FIG. 3 may include a first switched-capacitor integrator 110-1, a comparator 130, and a digital-to-analog converter (DAC) 150. The delta-sigma modulator 100-1 of FIG. 3 is a non-exhaustive example of the delta-sigma modulator 100 of FIG. 2.

The first switched-capacitor integrator 110-1 may sample an INPUT in response to control signals CTRL1 and CTRL2. While sampling the INPUT, the first switched-capacitor integrator 110-1 may generate an integral signal (INT) by integrating a difference between a feedback signal FB and the INPUT.

As an example, the first switched-capacitor integrator 110-1 may sample the INPUT based on a clock phase of the control signals CTRL1 and CTRL2, and generate the INT by integrating a difference between the feedback signal (FB) and the INPUT, while sampling the INPUT.

The first switched-capacitor integrator 110-1 may output the generated INT to the comparator 130. Descriptions about a configuration and an operation of the first switched-capacitor integrator 110-1 will be provided in further detail with reference to FIGS. 4 and 5.

The comparator 130 may compare the integral signal INT received at a first input terminal, for example, a negative input terminal and a reference signal Vref received at a second input terminal, for example, a positive input terminal, and generate the L-bit digital BS based on the comparison. The reference signal Vref may be generated by a reference signal generator (not shown).

The comparator 130 may output the L-bit digital BS to the digital filter 210 and the DAC 150. In a non-exhaustive example, the comparator 130 may be implemented as a one-bit ADC.

The DAC 150 may convert the L-bit digital BS into the feedback signal FB in response to a third control signal CTRL3 and output the converted feedback signal FB into the first switched-capacitor integrator 110-1. For example, the feedback signal FB may be an analog signal. In a non-exhaustive example, the DAC 150 may be implemented as a one-bit DAC.

Figure 4:
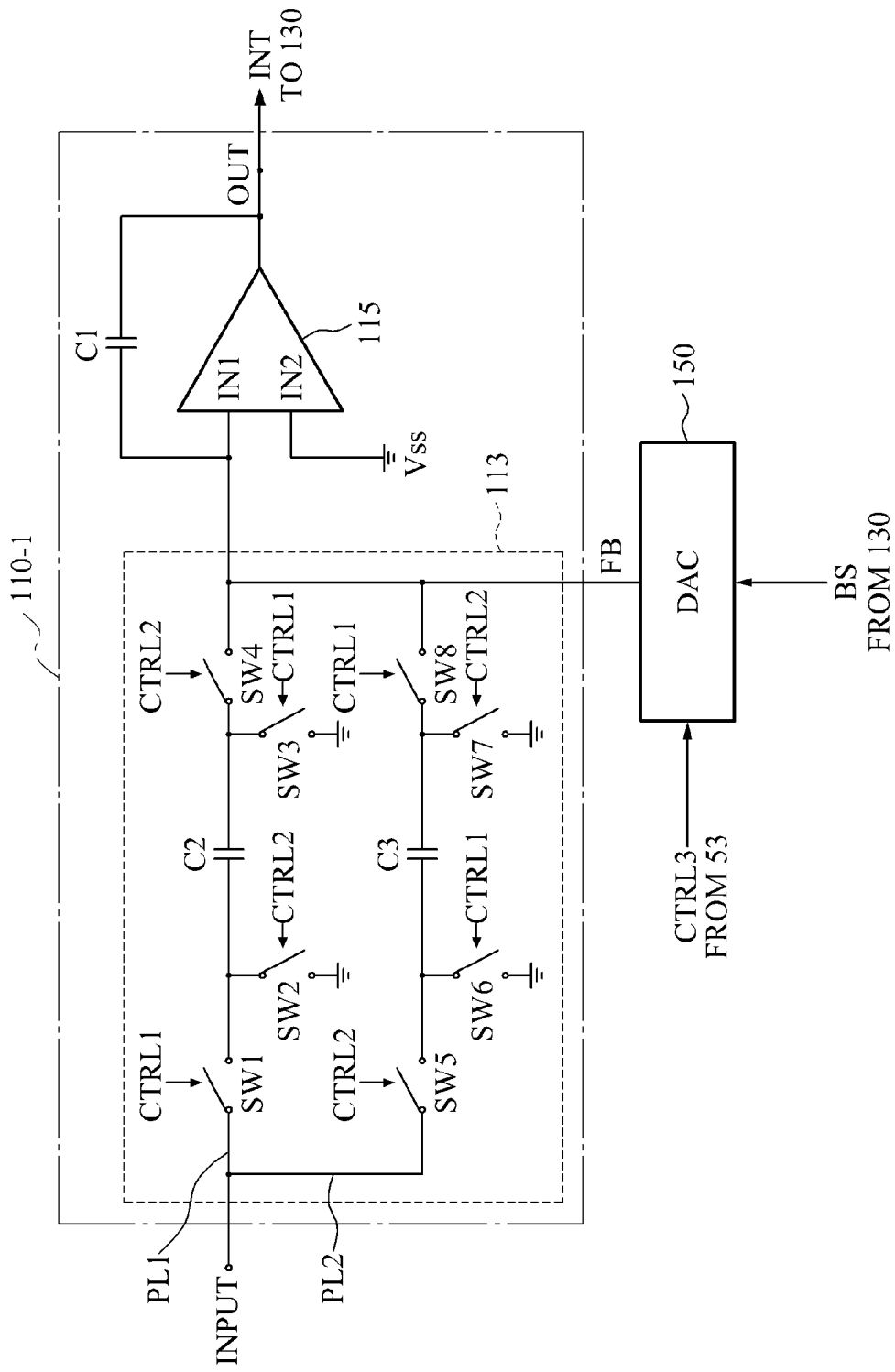
FIG. 4 is a diagram illustrating an example of the switched-capacitor integrator of FIG. 3.

FIG. 4 is a diagram illustrating an example of the first switched-capacitor integrator 110-1 of FIG. 3. Referring to FIGS. 1 through 4, the first switched-capacitor integrator 110-1 of FIG. 4 may include a switched-capacitor circuit 113, an amplifier 115, and a first capacitor C1. The amplifier 115 may include a first input terminal IN1, a second input terminal IN2, and an output terminal OUT. The first input terminal IN1 may be a negative input terminal and the second input terminal IN2 may be a positive input terminal. The second input terminal IN2 may be connected to a ground Vss.

The first capacitor C1 may be connected between the first input terminal IN1 and the output terminal OUT.

The switched-capacitor circuit 113 may be connected to the first input terminal IN1 of the amplifier 115. The switched-capacitor circuit 113 may sample the INPUT in response to control signals CTRL1 and CTRL2, and the switched-capacitor circuit 113 may integrate a difference between an FB and the INPUT using the first capacitor C1.

The switched-capacitor circuit 113 may include a first transmission path PL1, a second transmission path PL2, and an array of switches SW1 through SW8. The first transmission path PL1 may transmit the INPUT. The second transmission path PL2 may transmit the INPUT. Thus, the INPUT may be input through the first transmission path PL1 and the second transmission path PL2 simultaneously.

The first transmission path PL1 may include a second capacitor C2, and the second transmission path PL2 may include a third capacitor C3.

Based on a clock phase of the control signals CTRL1 and CTRL2, the array of switches SW1 through SW8 may be controlled to perform various tasks. The array of switches SW1 through SW8 may be controlled to sample the input signal INPUT transmitted through one of the first transmission path PL1 and the second transmission path PL2. The array of switches SW1 through SW8 may be controlled to simultaneously integrate a difference between the FB and the INPUT transmitted through another one of the first transmission path PL1 and the second transmission path PL2 using the first capacitor C1 while sampling the INPUT.

For example, in a first clock phase of the control signals CTRL1 and CTRL2, the array of switches SW1 through SW8 may be controlled to sample the INPUT transmitted through the first transmission path PL1. The array of switches SW1 through SW8 may be simultaneously controlled to integrate a difference between the feedback signal FB and the input signal INPUT transmitted through the second transmission path PL2 using the first capacitor C1.

For example, in the first clock phase of the control signals CTRL1 and CTRL2, switches SW1, SW3, SW6, and SW8 are ON and switches SW2, SW4, SW5, and SW7 are OFF. The input signal INPUT transmitted through the first transmission path PL1 may be sampled by the second capacitor C2, and the difference between the FB and the INPUT transmitted through the second transmission path PL2 may be integrated using the first capacitor C1.

In a second clock phase of the control signals CTRL1 and CTRL2, the array of switches SW1 through SW8 may be controlled to sample the INPUT transmitted through the second transmission path PL2. The array of switches SW1 through SW8 may be simultaneously controlled to integrate a difference between the FB and the INPUT transmitted through the first transmission path PL1 using the first capacitor C1.

For example, in the second clock phase of the control signals CTRL1 and CTRL2, switches SW2, SW4, SW5, and SW7 are ON and switches SW1, SW3, SW6, and SW8 are OFF. The INPUT transmitted through the second transmission path PL2 may be sampled by the third capacitor C3, and the difference between the FB and INPUT transmitted through the first transmission path PL1 may be integrated using the first capacitor C1.

Since the first switched-capacitor integrator 110-1 samples the INPUT and integrates the difference between the FB and the INPUT simultaneously, an identical OSR may be maintained when a sampling frequency of a sampling signal fs is reduced by 50%.

The second capacitor C2 and the third capacitor C3 may be capacitors for sampling the INPUT. The capacitance of the second capacitor C2 may be identical to a capacitance of the third capacitor C3.

The FB may be not be transmitted through the first transmission path PL1 and the second transmission path PL2. Thus, the first switched-capacitor integrator 110-1 may prevent an occurrence of mismatching between the second capacitor C2 and the third capacitor C3. The first switched-capacitor integrator 110-1 may resolve a phenomenon of noise folding resulting from the occurrence of mismatching.

The amplifier 115 may integrate the difference of the FB and the INPUT using the first capacitor C1, and generate an INT based on the integration. The amplifier 115 may be, for example, an operational amplifier or an operational transconductance amplifier (OTA). The amplifier 115 may output the INT to the comparator 130 through an output terminal OUT.

When a sampling frequency of a sampling signal fs is decreased by 50% in the first switched-capacitor integrator 110-1, a size of bandwidth of the amplifier 115 may be decreased by 50%. Thus, the first switched-capacitor integrator 110-1 may reduce power consumption of the amplifier 115.

When the sampling frequency is decreased by 50%, a size of bandwidth of an amplifier included in the delta-sigma ADC 30 of FIG. 1 may be decreased by 50%. Thus, power consumption of the amplifier may be reduced in the delta-sigma ADC 30 of FIG. 1, allowing the delta-sigma ADC 30 of FIG. 1 to operate in a low power state.

Figure 5:
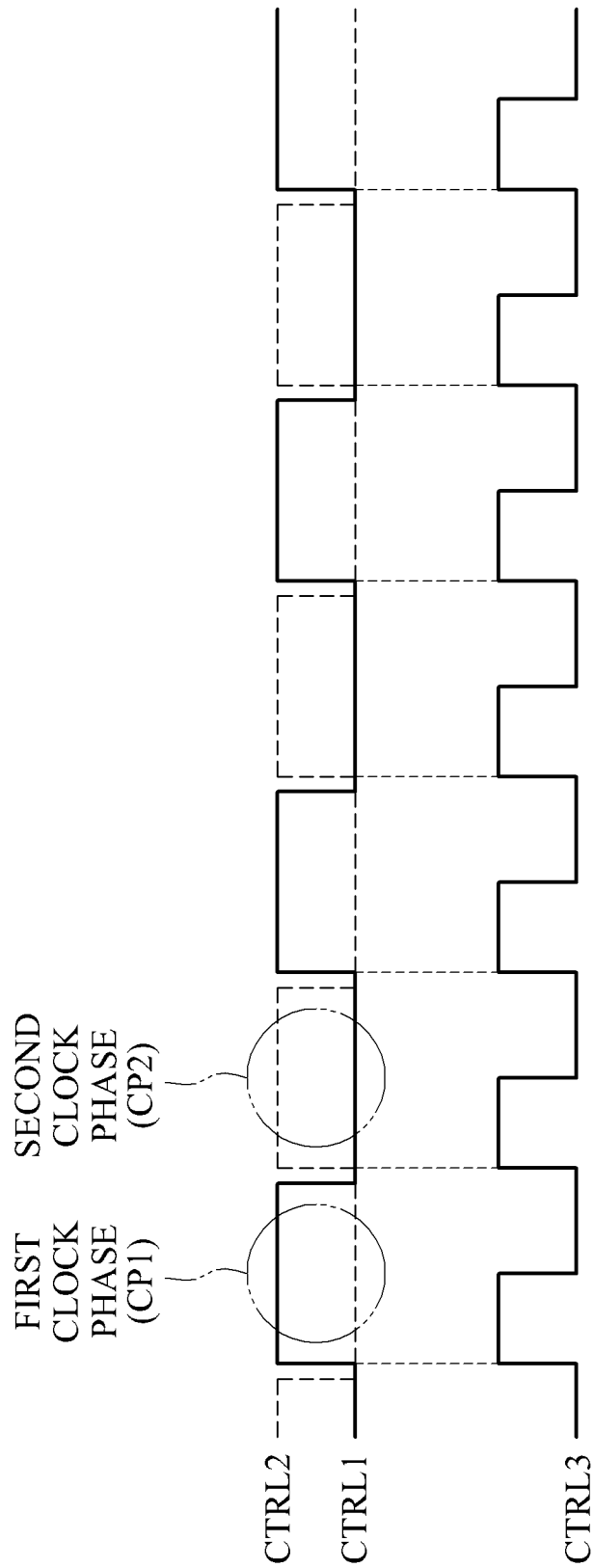
FIG. 5 is a diagram illustrating an example of an operation of the switched-capacitor integrator of FIG. 4.

FIG. 5 is a diagram illustrating an example of an operation of the first switched-capacitor integrator 110-1 of FIG. 4. Referring to FIGS. 1 through 5, when a first control signal CTRL1 corresponds to a first level, for example, a high level or a logic 1, and a second control signal CTRL2 corresponds to a second level, for example, a low level or a logic 0, a clock phase of the first control signal CTRL1 and the second control signal CTRL2 may form a first clock phase CP1.

When the first control signal CTRL1 corresponds to the second level, and the second control signal CTRL2 corresponds to the first level, the clock phase of the first control signal CTRL1 and the second control signal CTRL2 may form a second clock phase CP2. Each of the first control signal CTRL1 and the second control signal CTRL2 may be a non-overlapping clock signal.

The DAC 150 may output an FB to the first switched-capacitor integrator 110-1 in response to a third control signal CTRL3.

In the first clock phase CP1 of the first control signal CTRL1 and the second control signal CTRL2, the first switched-capacitor integrator 110-1 may sample an INPUT transmitted through a first transmission path PL1, and simultaneously integrate a difference between the FB and the INPUT transmitted through a second transmission path PL 2 using the first capacitor C1.

In the first clock phase CP1, since the first control signal CTRL1 corresponds to the high level and the second control signal CTRL2 corresponds to the low level, switches SW1, SW3, SW6, and SW8 may be ON and switches SW2, SW4, SW5, and SW7 may be OFF.

Accordingly, the input signal INPUT transmitted through the first transmission path PL1 may be sampled by the second capacitor C2, and the difference between the FB and the INPUT transmitted through the second transmission path PL2 may be integrated using the first capacitor C1.

In the second clock phase CP2 of the first control signal CTRL1 and the second control signal CTRL2, the first switched-capacitor integrator 110-1 may sample an INPUT transmitted through the second transmission path PL2, and simultaneously integrate a difference between the FB and the INPUT transmitted through the first transmission path PL 1 using the first capacitor C1.

In the second clock phase CP2, since the first control signal CTRL1 corresponds to the low level and the second control signal CTRL2 corresponds to the high level, switches SW2, SW4, SW5, and SW7 may be ON and switches SW1, SW3, SW6, and SW8 may be OFF.

Accordingly, the INPUT transmitted through the second transmission path PL2 may be sampled by a third capacitor C3 and the difference between the FB and the INPUT transmitted through the first transmission path PL1 may be integrated using the first capacitor C1.

Figure 6:
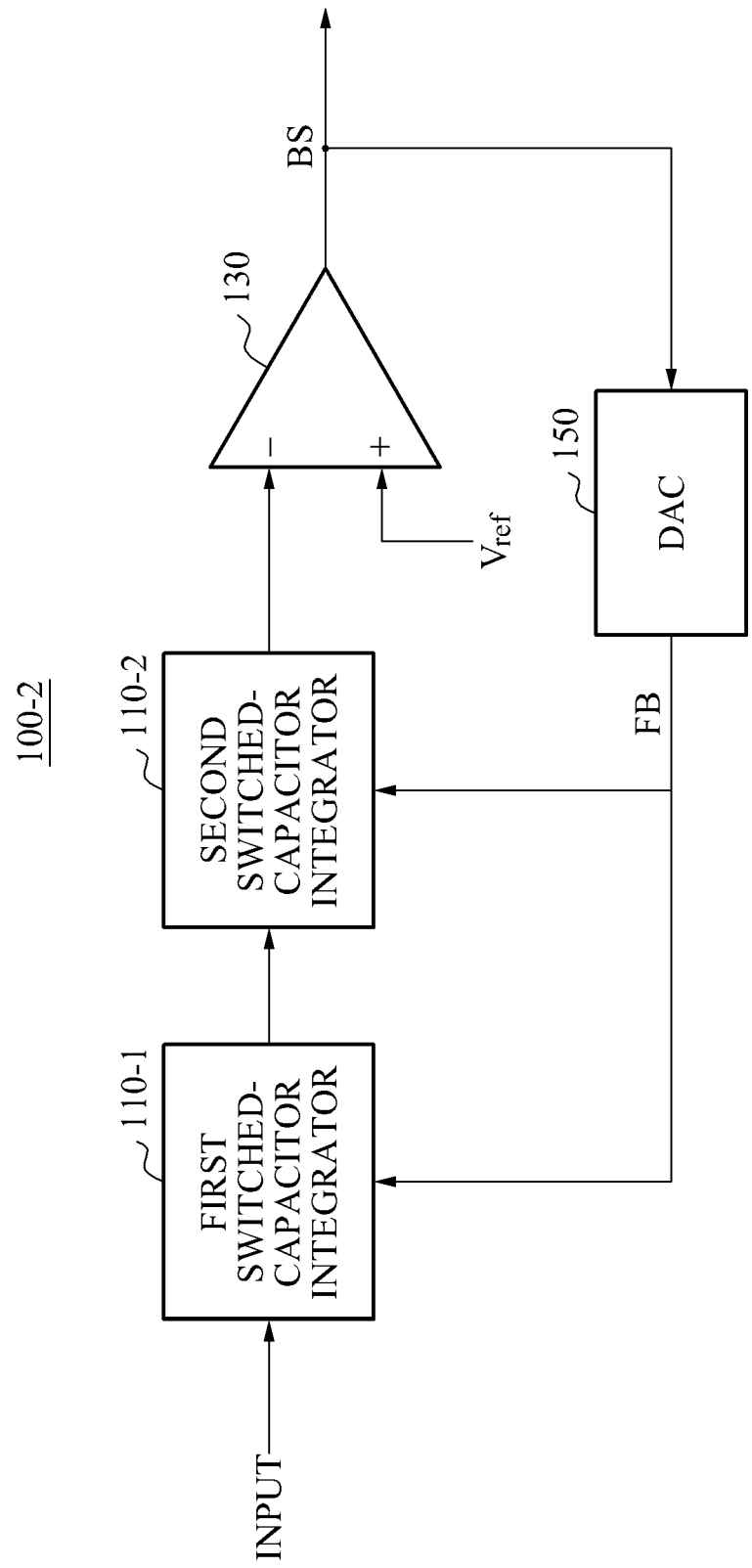
FIG. 6 is a diagram illustrating another example of the delta-sigma modulator of FIG. 2.

FIG. 6 is a diagram illustrating another example of the delta-sigma modulator 100 of FIG. 2. Referring to FIG. 6, the delta-sigma modulator 100-2 may include the first switched-capacitor integrator 110-1, the second switched-capacitor integrator 110-2, the comparator 130, and the DAC 150. The delta-sigma modulator 100-2 of FIG. 6 may be another example of the delta-sigma modulator 100 of FIG. 2.

A configuration and an operation of the second switched-capacitor integrator 110-2 of FIG. 6 may be identical to the configuration and the operation of the first switched-capacitor integrator 110-1 of FIG. 4. The above descriptions of switched-capacitor integrator 110-1 of FIG. 4, is also applicable to FIG. 6, and is incorporated herein by reference. Thus, the above description may not be repeated here.

An operation of the delta-sigma modulator 100-2 of FIG. 6 may be identical to the operation of the delta-sigma modulator 100-1 of FIG. 3, other than an operation of the second switched-capacitor integrator 110-2, which is included in the delta-sigma modulator 100-2 of FIG. 6. The above descriptions of delta-sigma modulator 100-1 of FIG. 3, is also applicable to FIG. 6, and is incorporated herein by reference. Thus, the above description may not be repeated here.

Figure 7:
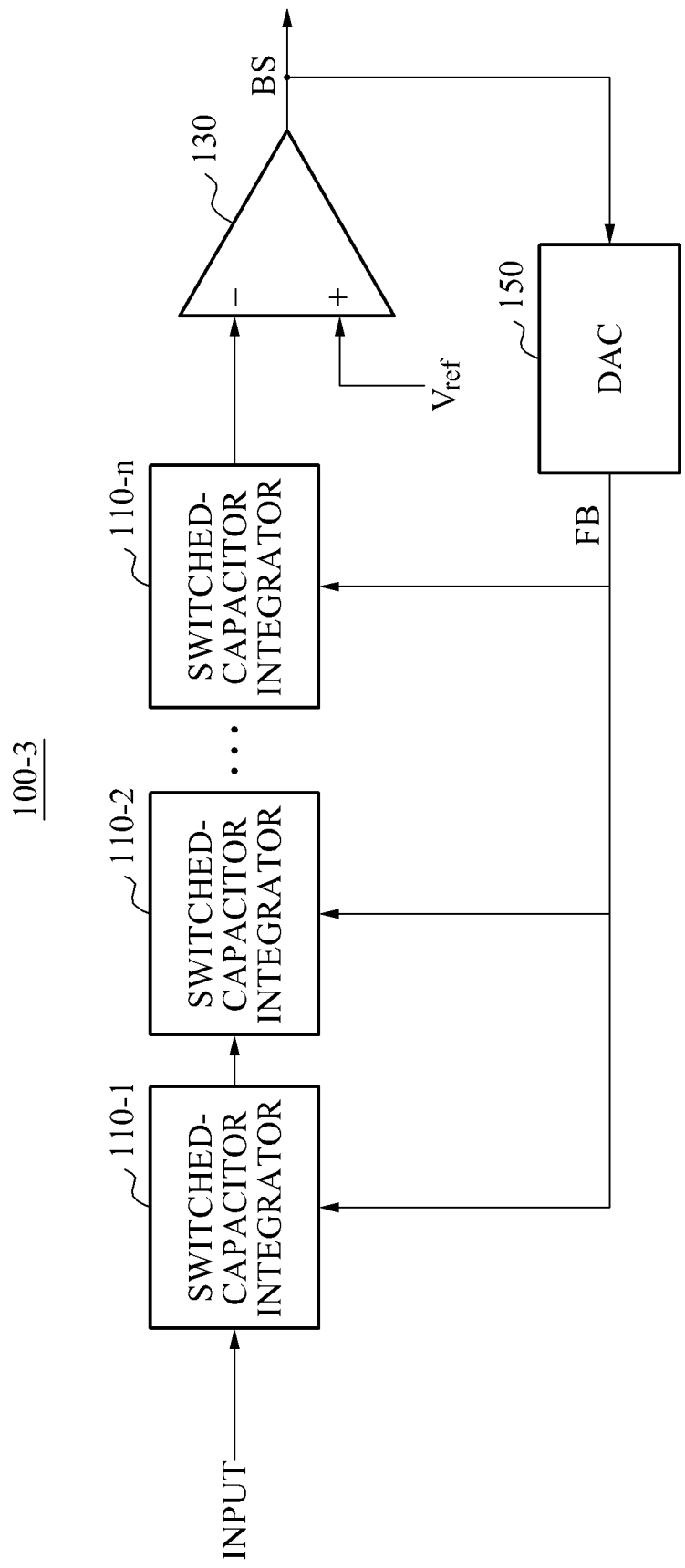
FIG. 7 is a diagram illustrating another example of the delta-sigma modulator of FIG. 2.

FIG. 7 is a diagram illustrating another example of the delta-sigma modulator 100 of FIG. 2. Referring to FIG. 7, a delta-sigma modulator 100-3 may include a plurality of switched-capacitor integrators. The switched-capacitor integrators may include the first switched-capacitor integrator 110-1, the second switched-capacitor integrator 110-2, and the nth switched-capacitor integrator 110-n, the comparator 130, and the DAC 150. Here, n denotes a natural number greater than "2."

A configuration and an operation of each of the a plurality of switched-capacitor integrators including the first switched-capacitor integrator 110-1, the second switched-capacitor integrator 110-2, and the nth switched-capacitor integrator 110-n of FIG. 7 may be identical to the configuration and the operation of the first switched-capacitor integrator 110-1 of FIG. 4. The above descriptions of switched-capacitor integrator 110-1 of FIG. 4, is also applicable to FIG. 7, and is incorporated herein by reference. Thus, the above description may not be repeated here.

An operation of the delta-sigma modulator 100-3 of FIG. 7 may be identical to the operation of the delta-sigma modulator 100-1 of FIG. 3. The above descriptions of delta-sigma modulator 100-1 of FIG. 3, is also applicable to FIG. 7, and is incorporated herein by reference. Thus, the above description may not be repeated here.

Figure 8:
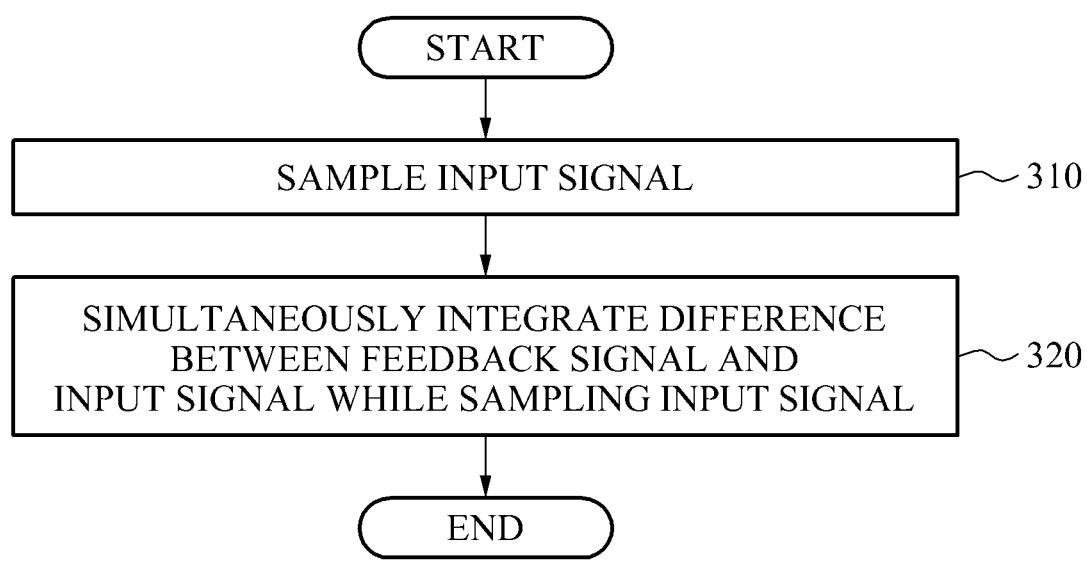
FIG. 8 is a diagram illustrating an example of an operation method of the switched-capacitor integrator of FIG. 3.

FIG. 8 is a diagram illustrating an example of an operation method of the first switched-capacitor integrator 110-1 of FIG. 3. The operations in FIG. 1 may be performed in the sequence and manner as shown, although the order of some operations may be changed or some of the operations omitted without departing from the spirit and scope of the illustrative examples described. Many of the operations shown in FIG. 8 may be performed in parallel or concurrently. The above descriptions of FIGS. 1-7, is also applicable to FIG. 8, and is incorporated herein by reference. Thus, the above description may not be repeated here.

Referring to FIGS. 1 through 5, and 8, in operation 310, the first switched-capacitor integrator 110-1 may sample an input signal INPUT based on a clock phase CP1 or a clock phase CP2 of control signals CTRL1 and CTRL2. In operation 320, the first switched-capacitor integrator 110-1 may simultaneously integrate a difference between an FB and the INPUT based on one of the clock phase CP1 and the clock phase CP2 of the control signals CTRL1 and CTRL2, while sampling the INPUT.

Figure 9:
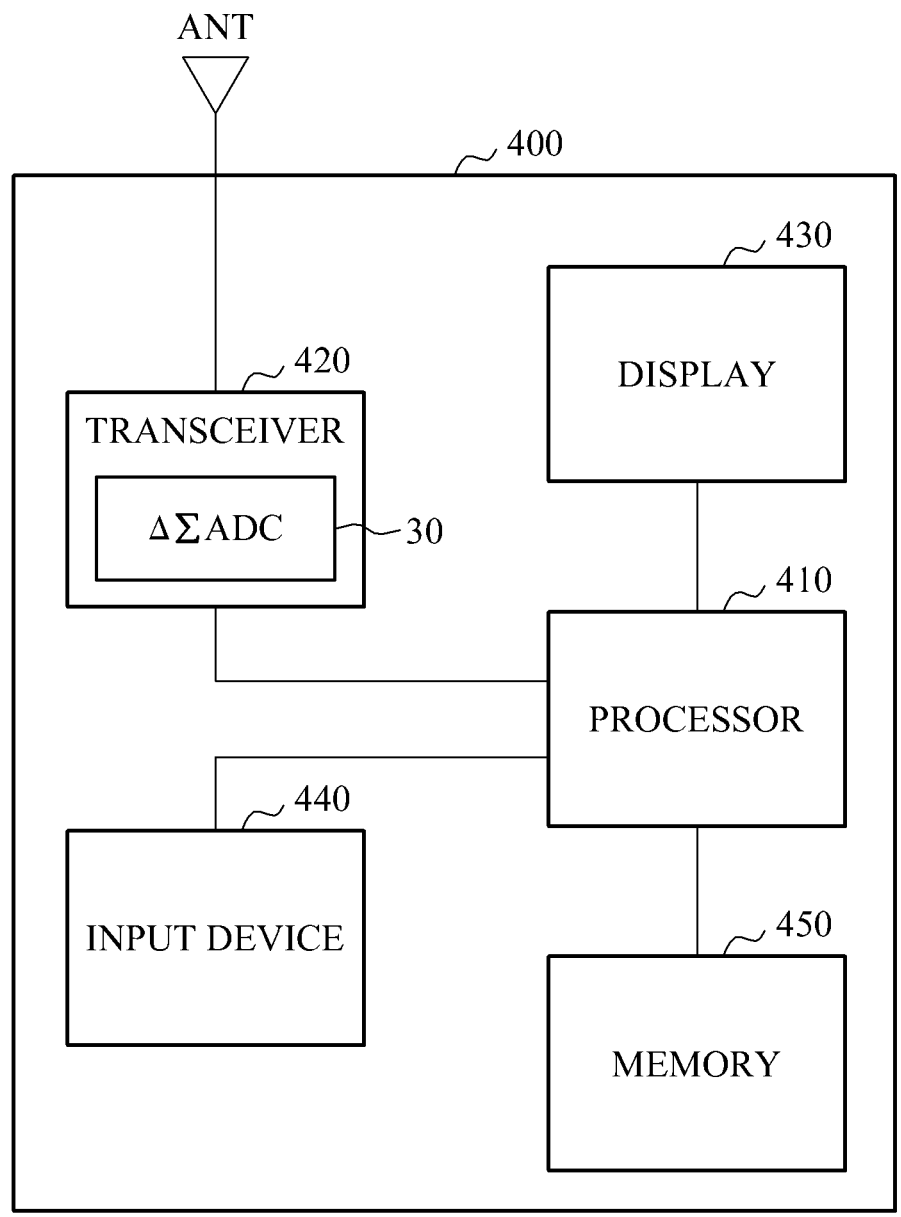
FIG. 9 is a diagram illustrating an example of the electronic system including the delta-sigma ADC of FIG. 1.

FIG. 9 is a diagram illustrating an example of the electronic system 10 including the delta-sigma ADC 30 of FIG. 1. Referring to FIG. 9, an electronic system 400 may include a processor 410, a transceiver 420, a display 430, an input device 440, and a memory 450. Only components related to the present example are illustrated in the electronic system 400 of FIG. 9. Thus, those skilled in the art may understand that general components except for components illustrated in FIG. 9 may be further included.

The electronic system 400 may be a PC, a data server, or the portable electronic device described above. The processor 410 may control an overall operation of the electronic system 400. For example, the processor 410 may control an operation of each of the transceiver 420, the display 430, the input device 440, and the memory 450.

The transceiver 420 may transmit or receive a signal or data using an antenna (ANT). For example, the transceiver 420 may convert a signal received through the ANT into a signal, for example, a digital signal, to be processed by the processor 410. The transceiver 420 may convert a signal received using a delta-sigma ADC 30 into the signal that is to be processed by the processor 410.

The processor 410 may process the signal output by the transceiver 420. The processor 410 may store the processed signal or may display the processed signal using the display 430.

The transceiver 420 may convert the signal output by the processor 410 into a wireless signal, and output the converted wireless signal to an external area using the antenna ANT. In this instance, the delta-sigma ADC may operates as a delta-sigma DAC.

The input device 440 may be a device to input a control signal for controlling the operation of the processor 410, or the signal or data to be processed by the processor 410. For example, the input device 440 may be a device, such as, for example, a touch pad, a touch screen, a monitor, a speaker, a computer mouse, a keypad, and a keyboard.

The processor 410 may control the display 430 to display data output from the memory, the signal output by the transceiver 420, and data output from the input device 440.

Figure 10:
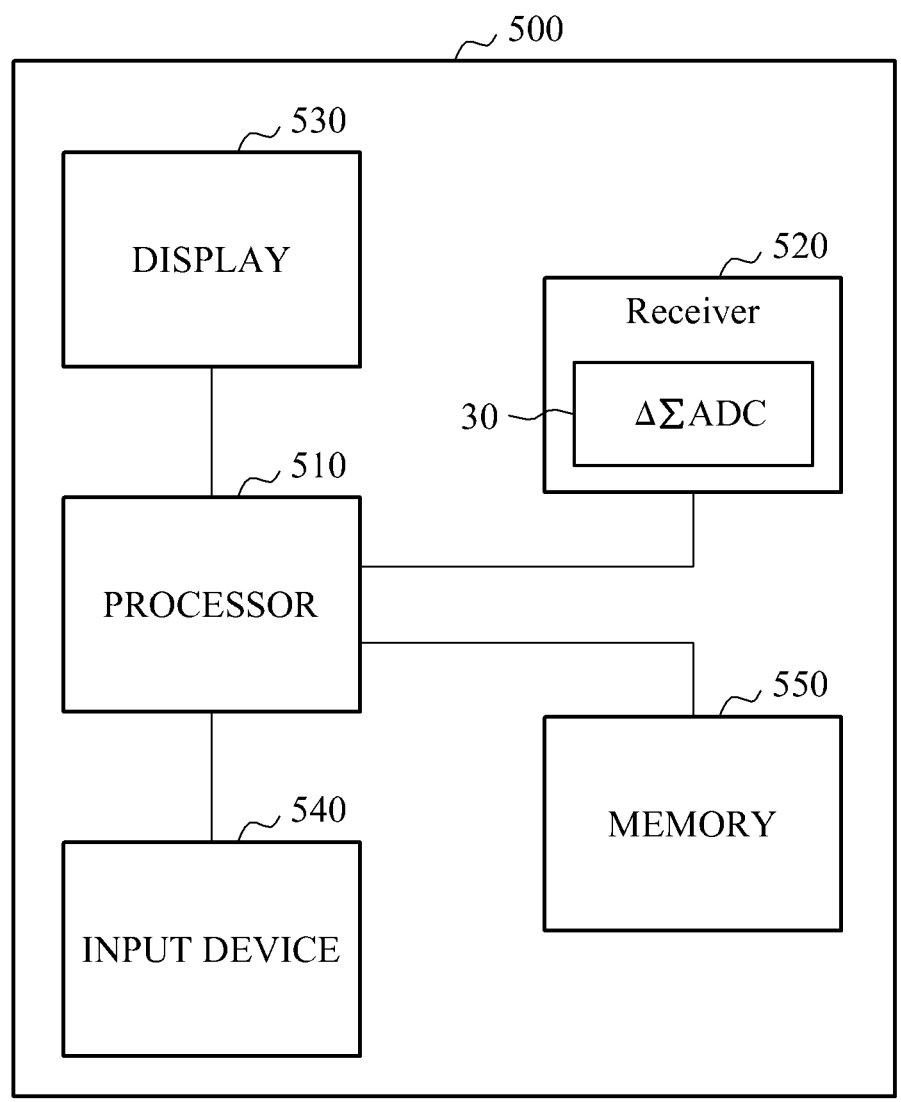
FIG. 10 is a diagram illustrating an example of the electronic system including the delta-sigma ADC of FIG. 1.

FIG. 10 is a diagram illustrating another example of the electronic system 10 including the delta-sigma ADC 30 of FIG. 1. Referring to FIG. 10, an electronic system 500 may include a processor 510, a receiver 520, a display 530, an input device 540, and a memory 550. Only components related to the present example are illustrated in the electronic system 500 of FIG. 10. Thus, those skilled in the art may understand that general components except for components illustrated in FIG. 10 may be further included.

The electronic system 500 may be implemented by a data processing device such as a PC, a data server, a tablet PC, a net-book, an e-reader, a PDA, a PMP, a Moving Pictures Experts Group (MPEG) Audio Layer-3 (MP3) player, an MPEG-4 Part 14 (MP4) player, or the portable electronic device described above.

The receiver 520 may receive a signal output by a transmitter (not shown), and convert the received signal into a signal, for example, a digital signal to be processed by the processor 510.

The receiver 520 may convert the received signal into the signal to be processed by the processor 510 using the delta-sigma ADC 30.

The processor 510 may process the signal output by the receiver. The processor 510 may store the processed signal in the memory or the processor 510 may display the processed signal using the display 530.

The input device 540 may be a device to input a control signal for controlling an operation of the processor 510, or a signal or data to be processed by the processor 510. For example, the input device 440 may be a device, such as, for example, a touch pad, a touch screen, a monitor, a speaker, a computer mouse, a keypad, and a keyboard.

The processor 510 may control the display 530 to display data output from the memory, the signal output by the receiver 520, and/or the data output from the input device 540.

Figure 11:
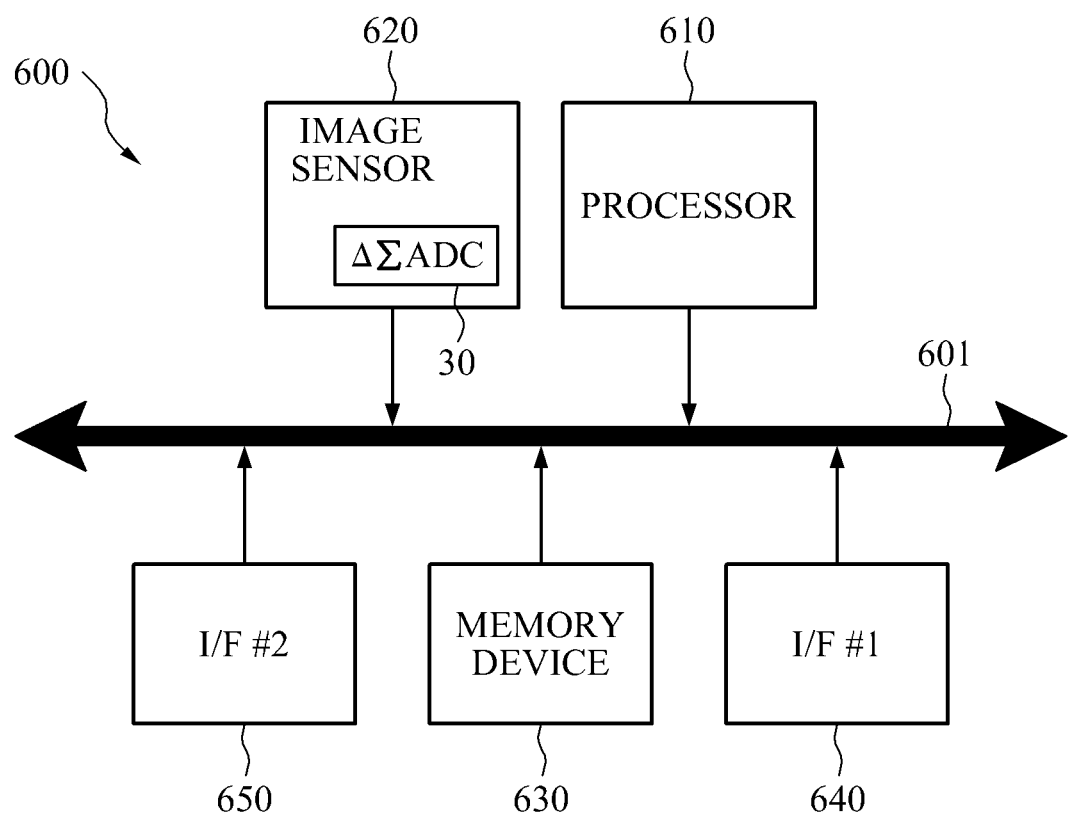
FIG. 11 is a diagram illustrating an example of the electronic system including the delta-sigma ADC of FIG. 1.

FIG. 11 is a diagram illustrating yet another example of the electronic system 10 including the delta-sigma ADC 30 of FIG. 1.

Referring to FIG. 11, an electronic system 600 may include a processor 610, an image sensor 620, a memory device 630, a first interface 640, and a second interface 650. Only components related to the present example are illustrated in the electronic system 600 of FIG. 11. Thus, those skilled in the art may understand that general components except for components illustrated in FIG. 11 may be further included.

The electronic system 600 may refer to an image processing device that generates an image by processing an image signal of an object that is sensed and output by the image sensor 620.

The electronic system 600 may refer to an image processing device, for example, a PC, a digital camera, a portable communication device mounting the digital camera such as a mobile phone, a PDA, and a PMP, a satellite communication (SATCOM) device, or the portable electronic device described above.

The processor 610 may communicate with each of the image sensor 620, the memory device 630, the first interface 640, and the second interface 650 through a bus 601. The processor 610 may process the image signal or image data output by the image sensor 620.

The image sensor 620 may generate image signals or image data, in a form of digital signals, from analog signals generated from a plurality of pixels. For example, the image sensor 620 may generate the image signals from the analog signals using the delta-sigma ADC 30.

The memory device 630 may store the signal or the data processed by the processor 610. In a non-exhaustive example, the memory device 630 may be implemented by a non-volatile memory, for example, an electrically erasable programmable read-only memory (EEPROM), a flash memory, a phase-change random-access memory (PRAM), a magnetoresistive random-access memory (MRAM), a resistive random-access memory (ReRAM), and the like. In another non-exhaustive example, the memory device 630 may be implemented by a volatile memory, for example, a dynamic random-access memory (DRAM), and a static random-access memory (SRAM).

The first interface 640 may output the signal or the data processed by the processor 610 to an external area, or transmit a signal or data input from the external area to the processor 610. Thus, the processor 610 may control the transmitting of the data stored in the memory device 630 to the external area via the first interface 640. The processor 610 may also store the data input via the first interface 640 in the memory device 630.

The second interface 650 may wirelessly output the signal or the data processed by the processor 610 to the external area. The processor 610 may also transmit the signal or the data wirelessly input from the external area to the processor 610.

FIG. 12 is a diagram illustrating further another example of the electronic system 10 including the delta-sigma ADC 30 of FIG. 1.

Referring to FIG. 12, an electronic system 700 may include a processor 710, an interface 720, a delta-sigma ADC 730, a transceiver 740, a memory 750, and a power device 770. Only components related to the present example are illustrated in the electronic system 500 of FIG. 10. Thus, those skilled in the art may understand that general components except for components illustrated in FIG. 10 may be further included. The electronic system 700 may also include a treatment device 760.

The electronic system 700 may be a device to monitor a patient, such as, for example, an electrocardiogram (ECG) device, an implantable medical device (IMD), a medical imaging device. For example, the IMD may include a pacemaker, an implantable cardioverter-defibrillator (ICD), and the like.

The electronic system 700 may monitor a patient. The electronic system 700 may provide a remedy to the patient directly or indirectly, based on a result of the monitoring.

The interface 720 may be a sensor interface and receive a sensing signal output from an external sensor (not shown). For example, the interface 720 may receive a sensing signal output from sensors, such as, for example, a pressure sensor, an accelerometer, an activity sensor, an impedimetric sensor, a temperature sensor, and/or a potential of hydrogen (pH) meter. The sensing sensor may be an analog signal.

The delta-sigma ADC 730 may convert the sensing signal transmitted by the interface 720 into a digital signal, and output the converted digital signal to the processor 710. The delta-sigma ADC 730 may be the delta-sigma ADC 30 of FIG. 1. The above descriptions of delta-sigma ADC 30 of FIG. 1, is also applicable to FIG. 12, and is incorporated herein by reference. Thus, the above description may not be repeated here. The delta-sigma ADC 730 may include a plurality of delta-sigma ADCs including the delta-sigma ADC 30.

The processor 710 may process the digital signal transmitted by the delta-sigma ADC 730. The processor 710 may store the processed signal or data in the memory 750, or the processor 710 may transmit the processed signal or data to a host (not shown) using the transceiver 740. For example, the host may control the electronic system 700. The processor 710 may control an operation of the treatment device 760 based on the processed signal or data.

The transceiver 740 may transmit the processed signal or data from the processor 710 to the host. The transceiver 740 may periodically communicate with the host.

The treatment device 770 may provide an operation power to the processor 710, the interface 720, the delta-sigma ADC 730, the transceiver 740, the memory 750, and the treatment device 760 included in the electronic system 700. The power device 770 may be a power source, such as, for example, a rechargeable power device, a non-rechargeable power device, or a fluidic power supply device.

The processes, functions, and methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a hardware component may include multiple processors or a processor and a controller. In addition, different processing configurations are possible, such a parallel processors.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A switched-capacitor integrator comprising:
    an amplifier comprising a first input terminal, a second input terminal, and an output terminal;
    a first capacitor disposed between the first input terminal and the output terminal; and
    a switched capacitor circuit configured to sample an input signal in response to control signals, and to integrate a difference between a feedback signal and the input signal using the first capacitor, while sampling the input signal.

2. The switched-capacitor integrator of claim 1, wherein the switched capacitor circuit comprises:
    a first transmission path to transmit the input signal;
    a second transmission path to transmit the input signal; and
    an array of switches configured:
        to sample the input signal transmitted through one of the first transmission path or the second transmission path, based on a clock phase of the control signals, and
        to integrate, using the first capacitor, a difference between the feedback signal and the input signal while sampling the input signal.

3. The switched-capacitor integrator of claim 2, wherein the array of switches is further configured:
    to sample the input signal transmitted through the first transmission path in a first clock phase of the control signals, and
    to integrate, using the first capacitor, a difference between the feedback signal and the input signal transmitted through the second transmission path.

4. The switched-capacitor integrator of claim 2, wherein the array of switches is further configured:
    to sample the input signal transmitted through the second transmission path in a second clock phase of the control signals, and
    to integrate, using the first capacitor, a difference between the feedback signal and the input signal transmitted through the first transmission path.

5. The switched-capacitor integrator of claim 2, wherein a second capacitor is disposed in the first transmission path and a third capacitor is disposed in the second transmission path.

6. The switched-capacitor integrator of claim 5, wherein a capacitance of the second capacitor is identical to a capacitance of the third capacitor.

7. The switched-capacitor integrator of claim 1, wherein the first input terminal is a negative input terminal, the second input terminal is a positive input terminal, and the second input terminal is connected to a ground.

8. The switched-capacitor integrator of claim 1, wherein the amplifier is one of an operational amplifier or an operational transconductance amplifier (OPA).

9. A delta-sigma modulator comprising:
    a digital to analog converter (DAC) to transmit a feedback signal; and
    a switched-capacitor integrator comprising:
        an amplifier comprising a first input terminal, a second input terminal, and an output terminal,
        a first capacitor disposed between the first input terminal and the output terminal,
        a first transmission path to transmit an input signal,
        a second transmission path to transmit the input signal, and
        switches configured to sample the input signal transmitted through one of the first transmission path or the second transmission path, based on a clock phase of the control signals, and to integrate, using the first capacitor, a difference between the feedback signal and the input signal while sampling the input signal.

10. The delta-sigma modulator of claim 9, further comprising:
    a comparator configured to generate an L-bit digital bitstream based on the integral signal and a reference signal, L being a real number.

11. The delta-sigma modulator of claim 9, wherein the switches are further configured:
    to sample the input signal transmitted through the first transmission path in a first clock phase of the control signals, and
    to simultaneously integrate, using the first capacitor, a difference between the feedback signal and the input signal transmitted through the second transmission path.

12. The delta-sigma modulator of claim 9, wherein the switches are further configured:
    to sample the input signal transmitted through the second transmission path in a second clock phase of the control signals, and
    to simultaneously integrate, using the first capacitor, a difference between the feedback signal and the input signal transmitted through the first transmission path.

13. The delta-sigma modulator of claim 9, wherein a second capacitor configured to sample the input signal is disposed in the first transmission path to, and a third capacitor configured to sample the input signal is disposed in the second transmission path.

14. The delta-sigma modulator of claim 13, wherein a capacitance of the second capacitor is identical to a capacitance of the third capacitor.

15. The delta-sigma modulator of claim 9, wherein the first input terminal is a negative input terminal, the second input terminal is a positive input terminal, and the second input terminal is connected to a ground.

16. The delta-sigma modulator of claim 9, wherein the amplifier is one of an operational amplifier or an operational transconductance amplifier (OPA).

17. The delta-sigma modulator of claim 9, further comprising a digital filter configured to filter an output signal of the delta-sigma modulator.

18. The delta-sigma modulator of claim 9, further comprising a plurality of switched-capacitor integrators configured to sample an input signal in response to control signals, and to integrate a difference between the feedback signal and the input signal to generate an integral signal while sampling the input signal.

19. A method of sampling an input signal, the method comprising:
   sampling an input signal based on a clock phase of control signals, at a switched capacitor integrator, the switched capacitor integrator comprising:
      an amplifier comprising a first input terminal, a second input terminal and an output terminal,
      a capacitor disposed between the first input terminal and the output terminal, and
      a switched capacitor circuit; and
   integrating a difference between the input signal and the feedback signal using the capacitor, while sampling the input signal.

* * * * *